US012683374B2

(12) United States Patent
Shrestha et al.

(10) Patent No.: US 12,683,374 B2
(45) Date of Patent: Jul. 14, 2026

(54) TESTING SYSTEM FOR DISTRIBUTED POWER DELIVERY PROTECTION OR CONTROL SYSTEM

(71) Applicant: Schweitzer Engineering Laboratories, Inc., Pullman, WA (US)

(72) Inventors: Arun Shrestha, Charlotte, NC (US); David Schmidt, Athens, GA (US); Vikram A P Simha, Pullman, WA (US); Dale S. Finney, Little Bras d'Or (CA); Daqing Hou, Matthews, NC (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 130 days.

(21) Appl. No.: 18/606,468

(22) Filed: Mar. 15, 2024

(65) Prior Publication Data

US 2025/0293505 A1 Sep. 18, 2025

(51) Int. Cl.
| | |
|---|---|
| *H02H 3/00* | (2006.01) |
| *G01R 19/25* | (2006.01) |
| *H02H 1/00* | (2006.01) |

(52) U.S. Cl.
CPC ......... *H02H 3/006* (2013.01); *G01R 19/2513* (2013.01); *H02H 1/0061* (2013.01); *H02H 1/0092* (2013.01)

(58) Field of Classification Search
CPC .... H02H 3/006; H02H 1/0061; H02H 1/0092; G01R 19/2513
See application file for complete search history.

(56) References Cited

U.S. PATENT DOCUMENTS

| | | | |
|---|---|---|---|
| 5,943,404 | A | 8/1999 | Sansom |
| 6,285,917 | B1 | 9/2001 | Sekiguchi |
| 6,333,932 | B1 | 12/2001 | Kobayasi |
| 6,396,279 | B1 | 5/2002 | Gruenert |
| 6,608,493 | B2 | 8/2003 | Hensler |
| 6,795,789 | B2 | 9/2004 | Vandiver |

(Continued)

OTHER PUBLICATIONS

David Costello: Understanding and Analyzing Event Report Information, Oct. 2000.

(Continued)

*Primary Examiner* — Thienvu V Tran
*Assistant Examiner* — Muaamar Qahtan Al-Taweel
(74) *Attorney, Agent, or Firm* — Fletcher Yoder, P.C.

(57) ABSTRACT

A system comprises a first intelligent electronic device (IED) configured to receive simulated electric power delivery system measurements and test configuration settings from a computing device, transmit a signal indicative of instructions to pause normal operation to a plurality of additional IEDs, transmit a signal comprising the simulated electric power delivery system measurements and the test configuration settings to each of the plurality of additional IEDs, transmit a signal indicative of instructions to begin a test procedure according to the simulated electric power delivery system measurements and the test configuration settings to each of the plurality of additional IEDs, receive a signal indicative of test results from each of the plurality of additional IEDs, and transmit a signal indicative of instructions to resume normal operation to the plurality of additional IEDs.

20 Claims, 11 Drawing Sheets

(56) References Cited

U.S. PATENT DOCUMENTS

| | | | |
|---|---|---|---|
| 6,847,297 B2 | 1/2005 | Lavoie | |
| 6,892,115 B2 | 5/2005 | Berkcan | |
| 6,892,145 B2 | 5/2005 | Topka | |
| 6,909,942 B2 | 6/2005 | Andarawis | |
| 6,985,784 B2 | 1/2006 | Vandevanter | |
| 6,999,291 B2 | 2/2006 | Andarawis | |
| 7,012,421 B2 | 3/2006 | Lavoie | |
| 7,043,340 B2 | 5/2006 | Papallo | |
| 7,058,481 B2 | 6/2006 | Jiang | |
| 7,058,482 B2 | 6/2006 | Fletcher | |
| 7,068,483 B2 | 6/2006 | Papallo | |
| 7,068,612 B2 | 6/2006 | Berkcan | |
| 7,111,195 B2 | 9/2006 | Berkcan | |
| 7,117,105 B2 | 10/2006 | Premerlani | |
| 7,151,329 B2 | 12/2006 | Andarawis | |
| 7,254,001 B2 | 8/2007 | Papallo | |
| 7,259,565 B2 | 8/2007 | Diercks | |
| 7,262,943 B2 | 8/2007 | Stellato | |
| 7,301,738 B2 | 11/2007 | Pearlman | |
| 7,460,590 B2 | 12/2008 | Lee | |
| 7,532,955 B2 | 5/2009 | Dougherty | |
| 7,636,616 B2 | 12/2009 | Fletcher | |
| 7,693,607 B2 | 4/2010 | Kasztenny | |
| 7,747,354 B2 | 6/2010 | Papallo | |
| 7,747,356 B2 | 6/2010 | Andarawis | |
| 7,986,503 B2 | 7/2011 | Papallo | |
| 8,024,494 B2 | 9/2011 | Soeda et al. | |
| 8,213,144 B2 | 7/2012 | Papallo | |
| 8,560,255 B2 | 10/2013 | Elwarry | |
| 8,891,963 B2 | 11/2014 | Patel | |
| 9,366,711 B2 | 6/2016 | Klapper | |
| 9,401,839 B2 | 7/2016 | Kidwell | |
| 9,632,147 B2 | 4/2017 | Hensler | |
| 9,819,611 B2 | 11/2017 | Snowdon | |
| 10,178,047 B2 | 1/2019 | Chapman | |
| 10,379,991 B2 | 8/2019 | Yang | |
| 10,740,253 B2 | 8/2020 | Sisler | |
| 11,119,128 B2 | 9/2021 | Schweitzer | |
| 11,431,605 B2 | 8/2022 | Bethmann | |
| 11,513,143 B2 | 11/2022 | Schweitzer | |
| 2003/0036822 A1 | 2/2003 | Davis | |
| 2003/0048508 A1 | 3/2003 | Yu | |
| 2005/0030693 A1 | 2/2005 | Deak | |
| 2005/0143941 A1 | 6/2005 | Forth | |
| 2007/0067132 A1 | 3/2007 | Tziouvaras | |
| 2007/0206644 A1* | 9/2007 | Bertsch | H02J 13/12 |
| | | | 370/503 |
| 2008/0225452 A1* | 9/2008 | Stoupis | H02J 13/13 |
| | | | 361/62 |
| 2009/0012728 A1* | 1/2009 | Spanier | |
| 2009/0070447 A1* | 3/2009 | Jubinville | H04L 67/025 |
| | | | 709/226 |
| 2009/0296583 A1 | 12/2009 | Dolezilek | |
| 2010/0040068 A1 | 2/2010 | Wimmer | |
| 2010/0153036 A1* | 6/2010 | Elwarry | G01R 21/133 |
| | | | 702/62 |
| 2010/0183298 A1 | 7/2010 | Biegert | |
| 2011/0112701 A1 | 5/2011 | Johnson | |
| 2012/0137356 A1 | 5/2012 | Kim | |
| 2012/0137359 A1 | 5/2012 | Kim | |
| 2013/0031164 A1* | 1/2013 | Sundaram | H02H 7/261 |
| | | | 709/203 |
| 2013/0250458 A1* | 9/2013 | Finney | H02H 3/05 |
| | | | 702/58 |
| 2014/0168838 A1* | 6/2014 | Zarghami | H02J 3/06 |
| | | | 361/86 |
| 2014/0321295 A1 | 10/2014 | Fella | |
| 2015/0229516 A1* | 8/2015 | Thanos | H04L 41/0809 |
| | | | 370/254 |
| 2016/0013632 A1 | 1/2016 | Lloyd | |
| 2017/0026291 A1 | 1/2017 | Smith | |
| 2017/0163029 A1 | 6/2017 | Hong | |
| 2017/0288950 A1 | 10/2017 | Manson | |
| 2017/0307676 A1* | 10/2017 | Gaouda | G01R 31/62 |
| 2018/0034689 A1 | 2/2018 | Kanabar | |
| 2018/0089057 A1 | 3/2018 | Yang | |
| 2018/0348267 A1 | 12/2018 | Yang | |
| 2021/0083506 A1 | 3/2021 | Rao | |

OTHER PUBLICATIONS

Joe Perez: A Guide to Digital Fault Recording Event Analysis, 2010.

Considerations for Use of Disturbance Recorders; a Report to the System Protection Subcommittee of the Power System Relaying Committee of the IEEE Power Engineering Society, Dec. 27, 2006.

David Costello: Event Analysis Tutorial, Part 1: Problem Statements 2011.

Jane Starck, Antti Hakala-Ranta, Martin Stefanka, Switchgear Optimization Using IEC 61850-9-2 and Non-Conventional Measurements May 23, 2012.

Will Allen, Tony Lee: Flexible High-Speed Load Shedding Using a Crosspoint Switch Oct. 2005.

Qiaoyin Yang, Rhett Smith: Improve Protection Communications Network Reliability Throught Software-Defined Process Bus, Jan. 2018.

Caitlin Martin, Steven Chase, Thanh-Xuan Nguyen, Dereje Jada Hawaz, Jeff Pope, Casper Labuschagne: Bus Protection Considerations for Various Bus Types; Oct. 2013.

* cited by examiner 200, 104, 106, 108, 115, 170, 178, 180

COMPUTING SYSTEM

| MEMORY | — 201 |
| PROCESSOR | — 202 |
| COMMUNICATION | — 203 |
| I/O | — 204 |
| DISPLAY | — 205 |
| UI | — 206 |

30 — NORMAL OPERATING MODE ⟷ 32 — TEST CONFIGURATION MODE ⟷ 34 — TEST MODE

TESTING SYSTEM FOR DISTRIBUTED POWER DELIVERY PROTECTION OR CONTROL SYSTEM

BACKGROUND

This disclosure relates to systems and methods for testing multiple devices and communication pathways. More particularly, this disclosure relates to performing synchronized tests on connected devices and communication pathways between them.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

Electric power delivery systems carry electricity from a transmission system to residential communities, factories, industrial areas, and other electricity consumers. An electric power delivery system may include various intelligent electronic devices (IEDs) that may communicate with other devices of the electric power delivery system during operation of the electric power delivery system. For example, an IED may receive and/or transmit a signal and/or data in order to perform a control function, such as to control a circuit breaker in response to electrical measurements of the electric power delivery system. In some cases, updates to these devices may be performed and validated on-site by a technician, but this process is difficult and time consuming when devices are numerous or remote.

DETAILED DESCRIPTION

Figure 1:
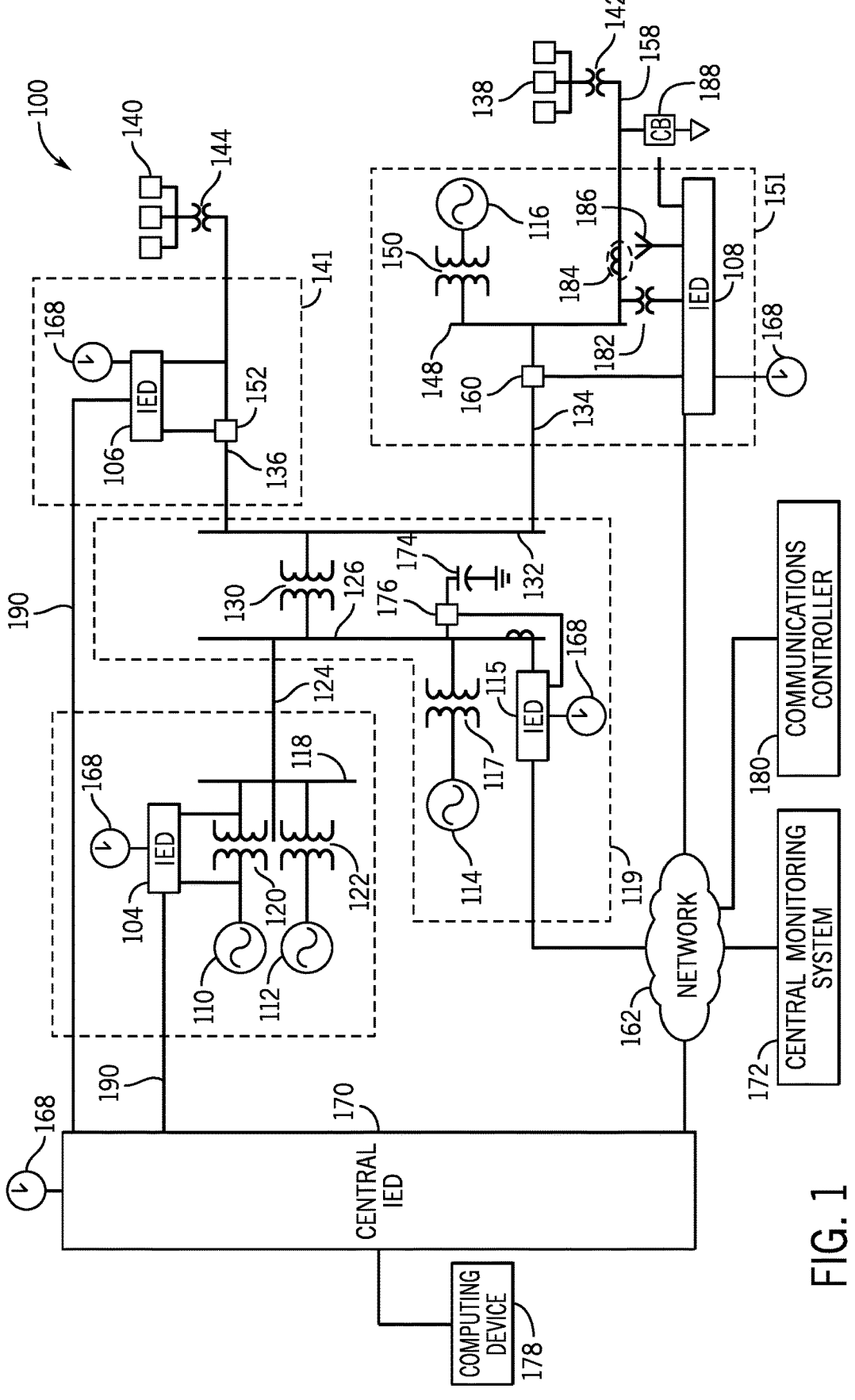
FIG. 1 is a schematic diagram of an electric power delivery system.

Turning to the drawings, FIG. 1 is a schematic diagram of an electric power distribution system 100 that may generate, transmit, and/or distribute electric energy to various loads (e.g., different structures). The electric power distribution system 100 may use various IEDs 104, 106, 108, 115 to control certain aspects of the electric power distribution system 100. As used herein, an IED (e.g., the IEDs 104, 106, 108, 115) may refer to any processing-based device that monitors, controls, automates, and/or protects monitored equipment within the electric power distribution system 100. Although the present disclosure primarily discusses the IEDs 104, 106, 108, 115 as relays, such as a remote terminal unit, a line current differential (e.g., 87L) relay, a distance relay, a directional relay, a feeder relay, an overcurrent relay, a voltage regulator control, a voltage relay, a breaker failure relay, a generator relay, and/or a motor relay, additional IEDs 104, 106, 108, 115 may include an automation controller, a bay controller, a meter, a recloser controller, a communications processor, a computing platform, a programmable logic controller (PLC), a programmable automation controller, an input and output module, and the like. Moreover, the term IED may be used to describe an individual IED or a system including multiple IEDs.

For example, the electric power distribution system 100 may be monitored, controlled, automated, and/or protected using the IEDs 104, 106, 108, 115, and a central monitoring system 172 (e.g., an industrial control system). In general, the IEDs 104, 106, 108, 115 may be used for protection, control, automation, and/or monitoring of equipment in the electric power distribution system 100. For example, the IEDs 104, 106, 108, 115 may be used to monitor equipment of many types, including electric power lines, current sensors, busses, switches, circuit breakers, reclosers, transformers, autotransformers, tap changers, voltage regulators, capacitor banks, generators, motors, pumps, compressors, valves, and a variety of other suitable types of monitored equipment.

A common time signal may, in some examples, be distributed throughout one or more devices of the electric power distribution system 100. Utilizing a common time source may ensure that IEDs 104, 106, 108, 115 have a synchronized time signal that can be used to generate time synchronized data, such as synchrophasors. In various embodiments, the IEDs 104, 106, 108, 115 may receive a common time signal 168. The time signal may be distributed in the electric power distribution system 100 using a communications network 162 and/or using a common time source, such as a Global Navigation Satellite System ("GNSS"), or the like.

The IEDs 104, 106, 108, 115 may be used for controlling various other equipment of the electric power distribution system 100. By way of example, the illustrated electric power distribution system 100 includes electric generators 110, 112, 114, 116 and power transformers 117, 120, 122, 130, 142, 144, 150. The electric power distribution system 100 may also include electric power lines 124, 134, 136, 158 and/or busses 118, 126, 132, 148 to transmit and/or deliver power, communications lines 190 to transmit communications, circuit breakers 152, 160, 176 to control flow of power in the electric power distribution system 100, and/or loads 138, 140 to receive the power in and/or from the electric power distribution system 100. A variety of other types of equipment may also be included in electric power distribution system 100, such as a voltage regulator, a capacitor (e.g., a capacitor 174), a potential transformer (e.g., a potential transformer 182), a current sensor (e.g., a wireless current sensor (WCS) 184), an antenna (e.g., an antenna 186), a capacitor banks (e.g., a capacitor bank (CB) 188), and other suitable types of equipment useful in power generation, transmission, and/or distribution.

A substation 119 may include the electric generator 114, which may be a distributed generator and which may be connected to the bus 126 through the power transformer 117 (e.g., a step-up transformer). The bus 126 may be connected to the distribution bus 132 via the power transformer 130 (e.g., a step-down transformer). Various electric power lines 136, 134 may be connected to the distribution bus 132. The electric power line 136 may lead to a substation 141 in which the electric power line 136 is monitored and/or controlled using the IED 106, which may selectively open and close the circuit breaker 152. The load 140 may be fed from the electric power line 136, and the power transformer 144 (e.g., a step-down transformer) in communication with the distribution bus 132 via electric power line 136 may be used to step down a voltage for consumption by the load 140.

The electric power line 134 may deliver electric power to the bus 148 of the substation 151. The bus 148 may also receive electric power from the distributed electric generator 116 via the power transformer 150. The electric power line 158 may deliver electric power from the bus 148 to the load 138 and may include the power transformer 142 (e.g., a step-down transformer). The circuit breaker 160 may be used to selectively connect the bus 148 to the electric power line 134. The IED 108 may be used to monitor and/or control the circuit breaker 160 as well as the electric power line 158.

According to various embodiments, the central monitoring system 172 may include one or more of a variety of types of systems. For example, the central monitoring system 172 may include a supervisory control and data acquisition (SCADA) system and/or a wide area control and situational awareness (WACSA) system. A central IED 170 may be in communication with the IEDs 104, 106, 108, 115 via the communications line 190. The IEDs 104, 106, 108, 115 may be remote from the central IED 170 and may communicate over various media. For instance, the central IED 170 may be directly in communication with the IEDs 104, 106 and may be in communication with the IEDs 108, 115 via the communications network 162.

The central IED 170 may enable or block data flow between any of the IEDs 104, 106, 108, 115. For example, during operation of the electric power distribution system 100, the IEDs 104, 106, 108, 115 may transmit data with one another to perform various functionalities for the electric power distribution system 100 by initially transmitting the data to the central IED 170. The central IED 170 may receive the data and may subsequently transmit the data to an intended recipient of the data. The central IED 170 may also control data flow between one of the IEDs 104, 106, 108, 115 and another device communicatively coupled to the central IED 170, such as a computing device 178. For instance, the computing device 178 may be a laptop, a mobile phone, a desktop, a tablet, or another suitable device with which a user (e.g., a technician, an operator) may interact. As such, the user may utilize the computing device 178 to receive data, such as operating data, from the electric power distribution system 100 via the central IED 170 and/or to send data, such as a user input, to the electric power distribution system 100 via the central IED 170. Thus, the central IED 170 may enable or block operation of the electric power distribution system 100 via the computing device 178.

A communications controller 180 may interface with equipment in the communications network 162 to create an SDN that facilitates communication between the central IED 170, the IEDs 104, 106, 108, 115, and/or the central monitoring system 172. In various embodiments, the communications controller 180 may interface with a control plane (not shown) in the communications network 162. Using the control plane, the communications controller 180 may direct the flow of data within the communications network 162. Indeed, the communications controller 180 may communicate with the central IED 170 to instruct the central IED 170 to transmit certain data (e.g., data associated with a certain set of characteristics or information) to a particular destination (e.g., an intended recipient) using flows, matches, and actions defined by the communications controller 180.

It may be desirable to test the operation of aspects of the electric power distributions system 100, such as the Central IED 170, the IEDs 104, 106, 108, 115, and the communication lines 190. For example, it may be desirable to assess how the aspects respond to a common anomalous power condition. Thus, embodiments of the present disclosure are directed to simplifying the manner in which aspects of an electric power distribution system are tested.

Figure 2:
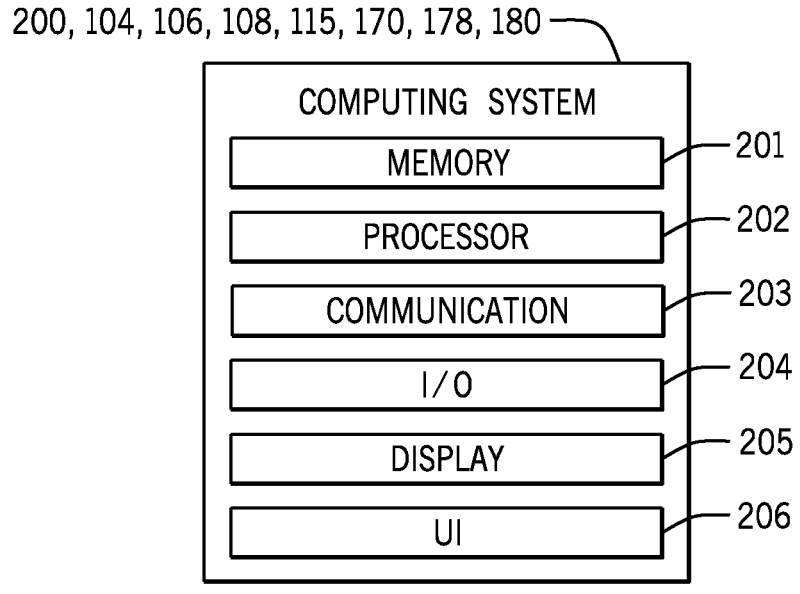
FIG. 2 is a block diagram of a computing system of the electric power delivery system.

FIG. 2 is a schematic diagram of an example of a computing system 200 that may be incorporated within a device of the electric power distribution system 100, such as in any of the IEDs 104, 106, 108, 115, the central IED 170, the computing device 178, and/or the communications controller or key device or 180. The computing system 200 may include a memory 201 and a processor or processing circuitry (e.g., data processing circuitry) 202. The memory 201 may include a non-transitory computer-readable medium that may store instructions that, when executed by the processor 202, may cause the processor 202 to perform various methods and/or operations described herein. To this end, the processor 202 may be any suitable type of computer processor or microprocessor capable of executing computer-executable code, including but not limited to one or more field programmable gate arrays (FPGA), application-specific integrated circuits (ASIC), programmable logic devices (PLD), programmable logic arrays (PLA), and the like. The processor 202 may include a single processor core or multiple processor cores.

The computing system 200 may also include a communication system 203, which may include a wireless and/or wired communication device to establish a secure communication link with another device of the electric power distribution system 100. That is, the communication system 203 enables the computing system 200 (e.g., of one of the IEDs 104, 106, 108, 115) to communication with another communication system 203 of another computing system 200 (e.g., of the central IED 170), such as via MACsec. Indeed, the communication system 203 may include any suitable communication circuitry for communication via a personal area network (PAN), such as Bluetooth or ZigBee, a local area network (LAN) or wireless local area network (WLAN), such as an 802.11x Wi-Fi network, and/or a wide area network (WAN), (e.g., third-generation (3G) cellular, fourth-generation (4G) cellular, near-field communications technology, universal mobile telecommunication system (UMTS), long term evolution (LTE), long term evolution license assisted access (LTE-LAA), fifth-generation (5G) cellular, and/or 5G New Radio (5G NR) cellular). The communication system 203 may also include a network interface to enable communication via various protocols such as EtherNet/IP®, ControlNet®, DeviceNet®, or any other suitable industrial communication network protocol.

Additionally, the computing system 200 may include input/output (I/O) ports 204 that may be used for communicatively coupling the computing system 200 to an external device. For example, the I/O ports 204 of the computing system 200 of the central IED 170 may communicatively couple to corresponding I/O ports 204 of the computing system 200 of the computing device 178. The computing system 200 may further include a display 205 that may present any suitable image data or visualization. Indeed, the display 205 may present image data that includes various information regarding the electric power distribution system 100, thereby enabling the user to observe an operation, a status, a parameter, other suitable information, or any combination thereof, of the electric power distribution system 100. Further still, the computing system 200 may include a user interface (UI) 206 with which the user may interact to control an operation of the computing system 200. For instance, the UI 206 may include a touch screen (e.g., as a part of the display 205), an eye-tracking sensor, a gesture (e.g., hand) tracking sensor, a joystick or physical controller, a button, a knob, a switch, a dial, a trackpad, a mouse, another component, or any combination thereof. As an example, the user may utilize the UI 206 of the computing system 200 of the computing device 178 to transmit data to the central IED 170.

Figure 3:
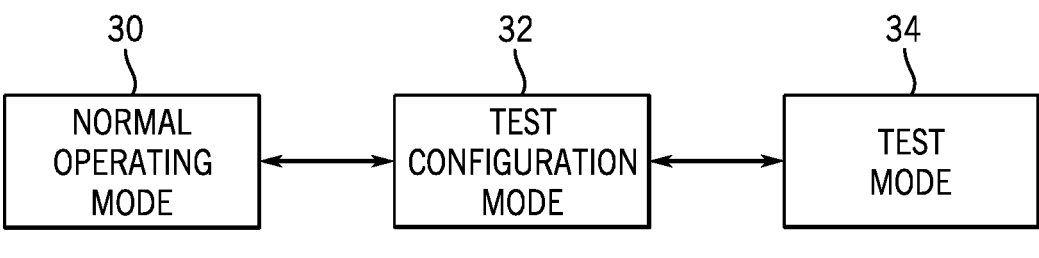
FIG. 3 is a block diagram illustrating an operation to switch between modes of a connected intelligent electronic device (IED).

FIG. 3 is a block diagram illustrating an operation for an IED (e.g., the central IED 170, any of the IEDs 104, 106, 108, 115) to switch between operating modes when testing an electric power distribution system. While the operating modes are described as that of an IED, in some examples, other aspects of the power distribution may also function according to the operating modes. The operating modes may include a normal operating mode 30, in which the IED may perform protection, control, automation, and/or monitoring, such as 87L line current differential protection, of equipment in an electric power distribution system (e.g., the electric power distribution system 100). When operating in the normal operating mode 30, the IED may have protection communications, warnings, alarms, and so on enabled, such that it may perform the aforementioned functions. However, test functions, event playbacks, and other simulation capabilities may be disabled while the IED is in the normal operating mode 30.

To pause normal operation of the IED, the IED may transition to a test configuration mode 32. As described in more detail below, the IED may transition to the test configuration mode upon, for example, receiving instruction from a primary IED, receiving a signal indicative of instructions to enter the test configuration mode 32, or as part of a scheduled maintenance routine. The transition to test configuration mode 32 may be further supervised by a local security setting which blocks remote instructions under certain conditions. The test configuration mode 32 may disable the protection communications of the IED, may block the warnings and alarms associated with the IED, and may enable test and/or simulation capabilities of the IED. Additionally, the test configuration mode 32 may include the IED receiving, loading (e.g., storing), and configuring simulation data, including event playback files and playback parameters. In an example, the simulation data may include Common Format for Transient Data Exchange (COMTRADE) data related to a power system disturbance.

To facilitate a testing procedure of the IED, the IED may transition into operation according to a test mode 34. The test mode 34 may include the protection communications of the IED being enabled, such that it may receive and transmit signals associated with protection functions of the IED. However, in the test mode 34, the protection communications may be used for the enabled simulation functions of the IED, and may not produce tangible protection or control outcomes in the power distribution system, as will be described in more detail below. Additionally, warnings and alarms of the IED indicative of electrical disturbances, faults, and the like in the power distribution system may be disabled in the test mode 34.

Further, in the test mode 34, the IED may interpret the simulation data, and may generate and transmit protection communications (e.g., signals) based on the simulation data. The simulation data may include digital data, and the digital data may include simulated power distribution system values, such as currents, voltages, frequencies, and the like. The simulation data may also include, for example, event reports that simulate conditions of the power distribution system that may be of interest for testing purposes, such as current spikes, over voltages, short-circuits, and so on. In response, the IED may generate protection communications, and the protection communications may be indicative of the behavior of the IED in response to actual power distribution system values.

Figure 4:
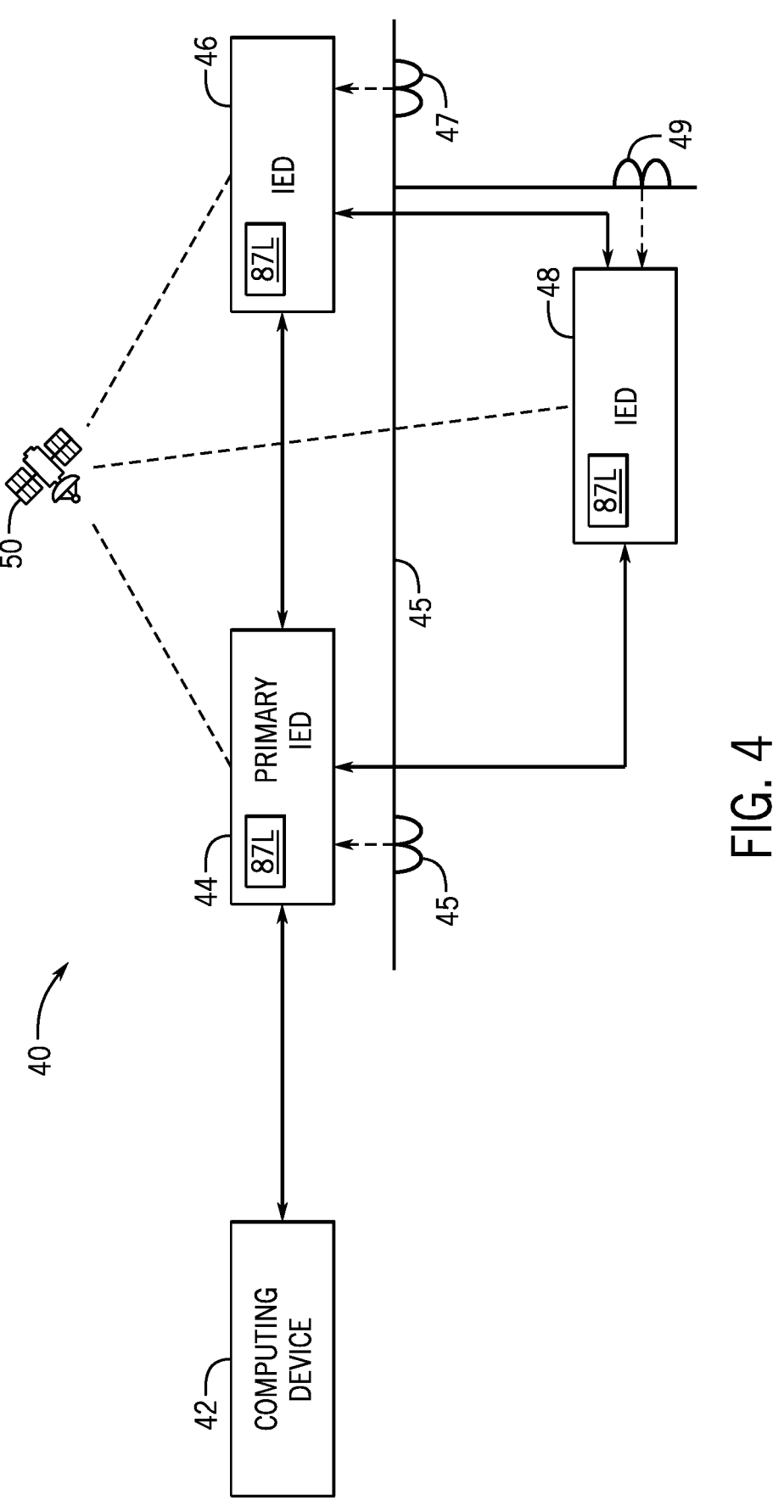
FIG. 4 is a block diagram illustrating communication pathways between devices of a power delivery system.

FIG. 4 is a schematic block diagram illustrating a system 40 including a computing device 42, a primary IED 44, IEDs 46 and 48, and common time source 50. The system 40 may be part of, or used in conjunction with, an electric power distribution system. For example, the computing device 42 may represent the computing device 178 of FIG. 1, the primary IED 44 may represent the central IED 170 of FIG. 1, the IEDs 46 and 48 may represent the IEDs 104 106, 108, or 115 of FIG. 1, and the common time source 50 may provide the common time signal 168 of FIG. 1. Further, the system 40 may monitor an electric power line 41, which may represent the electric power lines 124, 134, 136, or 158 of the system 100. For example, the primary IED 44 may monitor electric power line 41 based on measurements from a first current transformer 45, the IED 46 may monitor the electric power line 41 based on measurements from a second current transformer 47, and the IED 48 may monitor the electric power line 41 based on measurements from a third current transformer 49. Additionally, the computing device 42, the primary IED 44, the IEDs 46 and 48, or any combination thereof may be communicatively connected via, for example, the communication lines 190 of FIG. 1. The communication lines may include protection signaling channels, serial channels (e.g., serial 87L), ethernet channels (e.g., ethernet 87L), and/or other channels of suitable communication protocols. In some examples, the communication lines are present as part of the power distribution system. As such, the system 40 may use the communication lines, and additional communication lines may not need to be added for operation of the system 40. It should be understood while FIG. 4 illustrates three IEDs, a system may include any number of IEDs (e.g., 5, 10, 50, or 200 IEDs). For example, a system may include numerous IEDs included in an electrical grid.

In some examples, the primary IED 44 and the IEDs 46 and 48 may be used in conjunction to perform functions of the power distribution system. For example, the primary IED 44 and the IEDs 46 and 48 may be used to monitor and protect a particular portion of an electrical grid, and may communicate protection signals to and from each other IED. The IED 46 may provide supplemental capabilities (e.g., backup capabilities) for the IED 48, the primary IED 44 may send protection signals to the IED 46 based on sensed power distribution conditions, and so on. Further, the illustrated IEDs may rely on each other in response to anomalous conditions, and thus it may be desirable to test the illustrated IEDs together and/or simultaneously to properly characterize behavior of the illustrated IEDs in response to anomalous conditions.

While primary IED 44 is illustrated as the primary IED, in other examples, the IED 46 or the IED 48 may assume the role of primary IED. Each IED in the system 40 may include primary IED capabilities, and which IED of the system 40 is designated as the primary IED may depend on, for example, which IED the computing device 42 is communicatively coupled to. That is, the system 40 may be arranged with any of the illustrated IEDs as a primary IED. In any case, as will be described in more detail below, the primary IED 44 may provide capabilities for the IEDs 46 and 48 when performing an operation to test the system 40.

Figure 5:
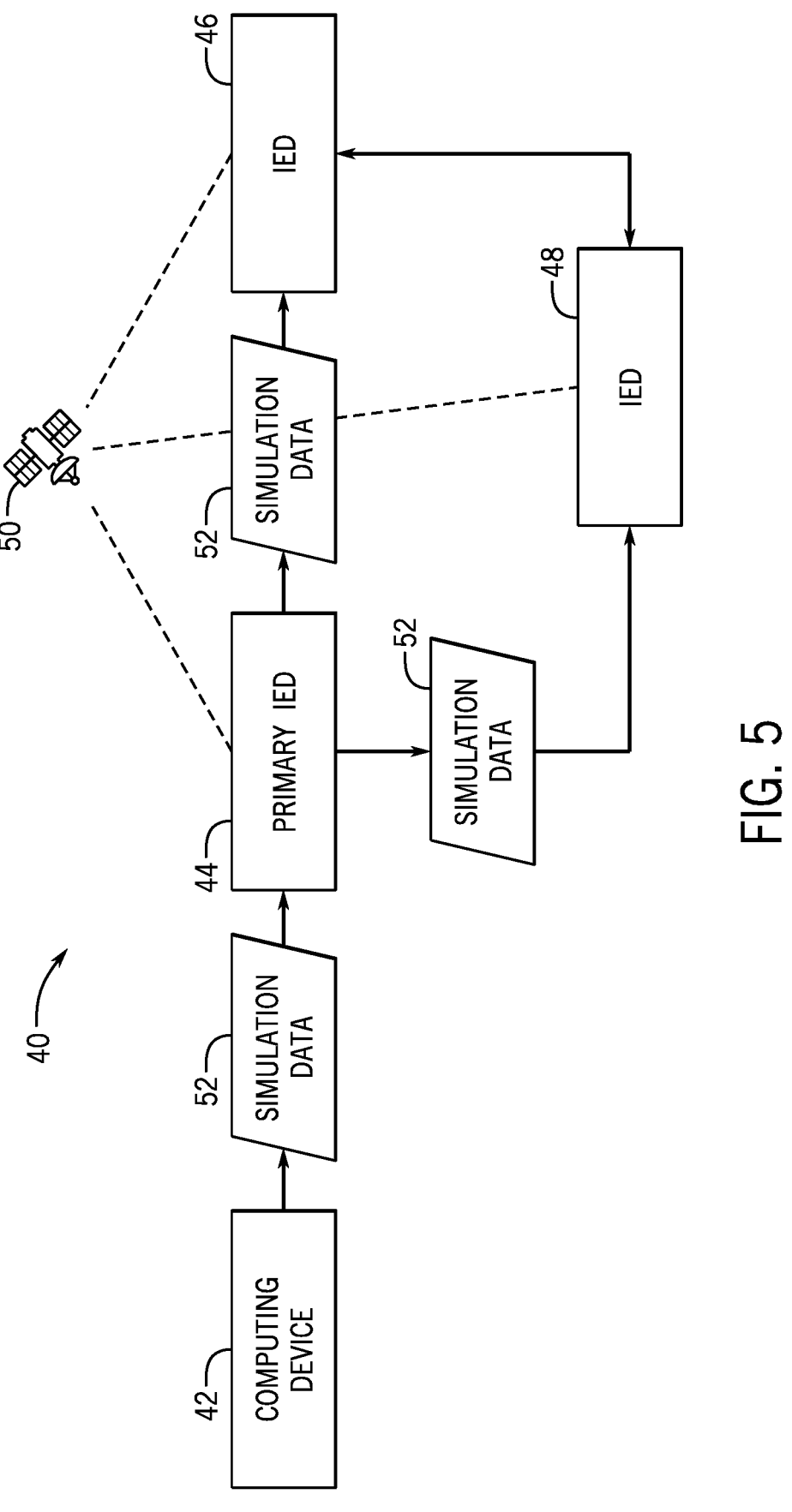
FIG. 5 is a block diagram illustrating an operation for distributing simulation data to IEDs of a power delivery system.

FIG. 5 is a schematic block diagram illustrating the system 40 in which simulation data 52 is distributed to the primary IED 44 and the IEDs 46 and 48. The simulation data 52 may be stored in the computing device 42 and selected by an operator of the computing device 42, generated by the computing device 42, or input by an operator of the computing device 42 via, for example, the UI of the computing device 42. Further, the simulation data 52 may include power delivery system measurements previously acquired by the primary IED 44, the IED 46, and/or the IED 48. The previously acquired power delivery system measurements may be representative of an electrical fault or other event of interest, and may be acquired by the primary IED 44, the IED 46, and/or the IED 48 acting as digital fault recorders (DFRs), for example. In the illustrated example, simulation data 52 is sent from the computing device to the primary IED 44 via, for example, a wired communicative connection (e.g., USB, ethernet, etc.). When the primary IED 44 receives the simulation data 52, it may send (e.g., forward, route) the simulation data 52 to the IED 46 and the IED 48 over, for example, ethernet connection.

Prior to or along with distribution of the simulation data 52, the primary IEDs 44 and the IEDs 46 and 48 may be placed in test configuration mode. As described herein, the test configuration mode may disable the protection communications of the IED, may block the warnings and alarms associated with the IED, and may enable test and/or simulation capabilities of the IED. Additionally, the test configuration mode may enable the IED to receive, load and configure simulation data, including event playback files and playback parameters. Each IED may store the simulation data in memory for later use, such as when a testing process is initiated.

Figure 6:
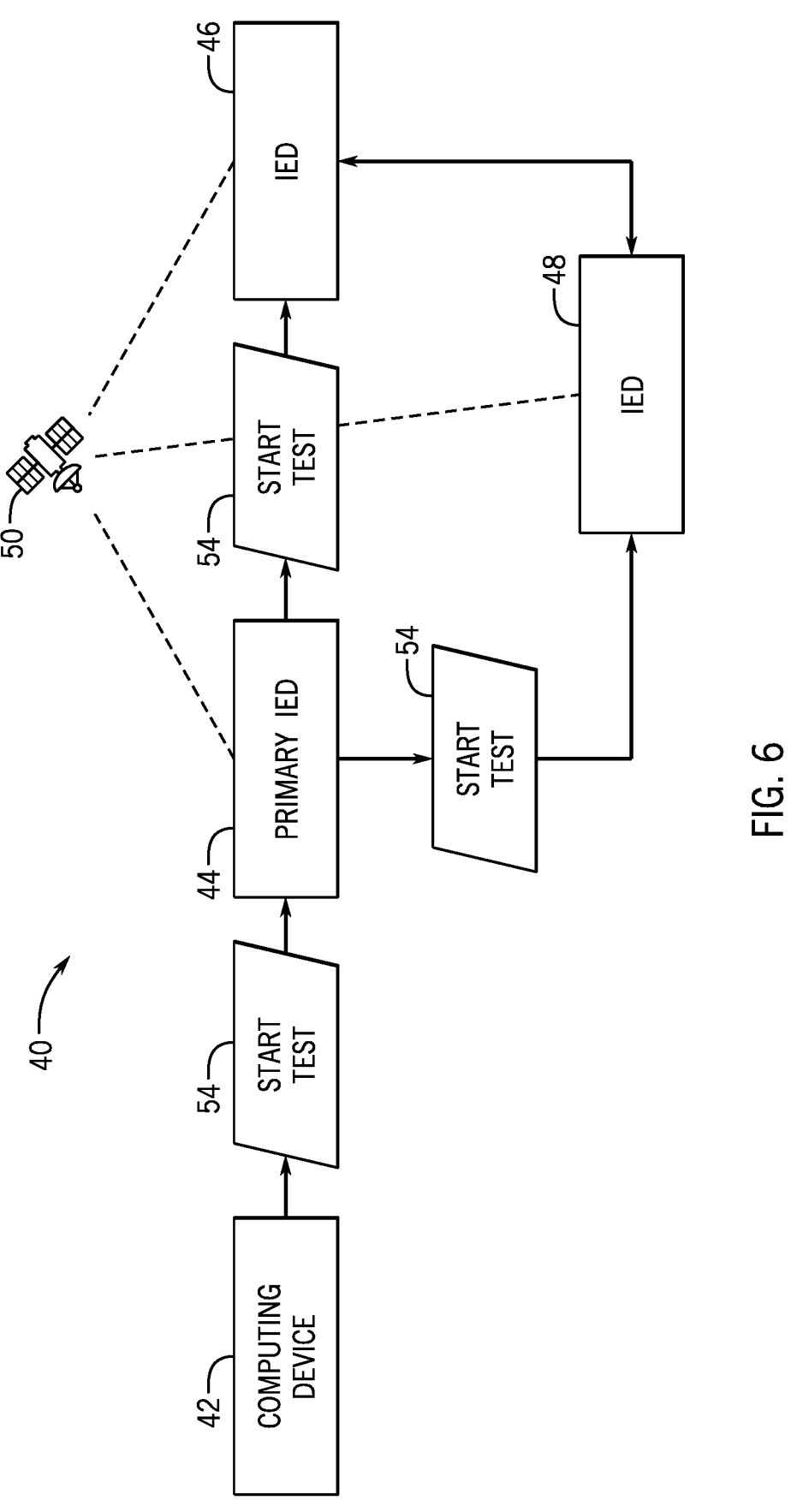
FIG. 6 is a block diagram illustrating an operation for initiating a test of IEDs of a power delivery system.

FIG. 6 is a schematic block diagram illustrating the system 40 when a test is initiated at the primary IED 44 and the IEDs 46 and 48. As described herein, the illustrated IEDs may be placed in test mode prior to or along with a test being initiated. The test mode may include the protection communications of each of the IEDs being enabled. However, under the test configuration mode, the protection communications may not produce tangible protection outcomes in the power distribution system. For example, under the test configuration mode, the protection communications may be sent to and from IEDs 44, 46, and 48, but may be unable to trip a circuit breaker, sound an alarm, distribute warnings, and so on. Thus, faults or technical errors associated with the simulation data may not cause damage to the system 40 or an associated power distribution system, while protection signals may continue to be generated and transmitted for evaluation purposes.

The test may be initiated at the computing device 42 upon, for example, operator input via the UI or an automatic maintenance process. The computing device may then send a signal indicative of instructions to start the test 54 to the primary IED 44, and the primary IED may forward the instructions 54 to the IEDs 48 and 46. Additionally, the instructions 54 may include a time at which the test is to commence (e.g., 16:30 UTC, 2:00 p.m. EDT), or a countdown timer value (e.g., T-30 seconds) to start the test. As described herein, the primary IED 44 and IEDs 46 and 48 may maintain a common time via common time source 50. Common time source 50 may include, for example, a satellite, and the common time may be distributed via GNSS. In some examples, the common time may be generated at the primary IED 44 and distributed to the IEDs 46 and 48, and the primary IED 44 may control the timing of a testing procedure of the system 40.

Figure 7:
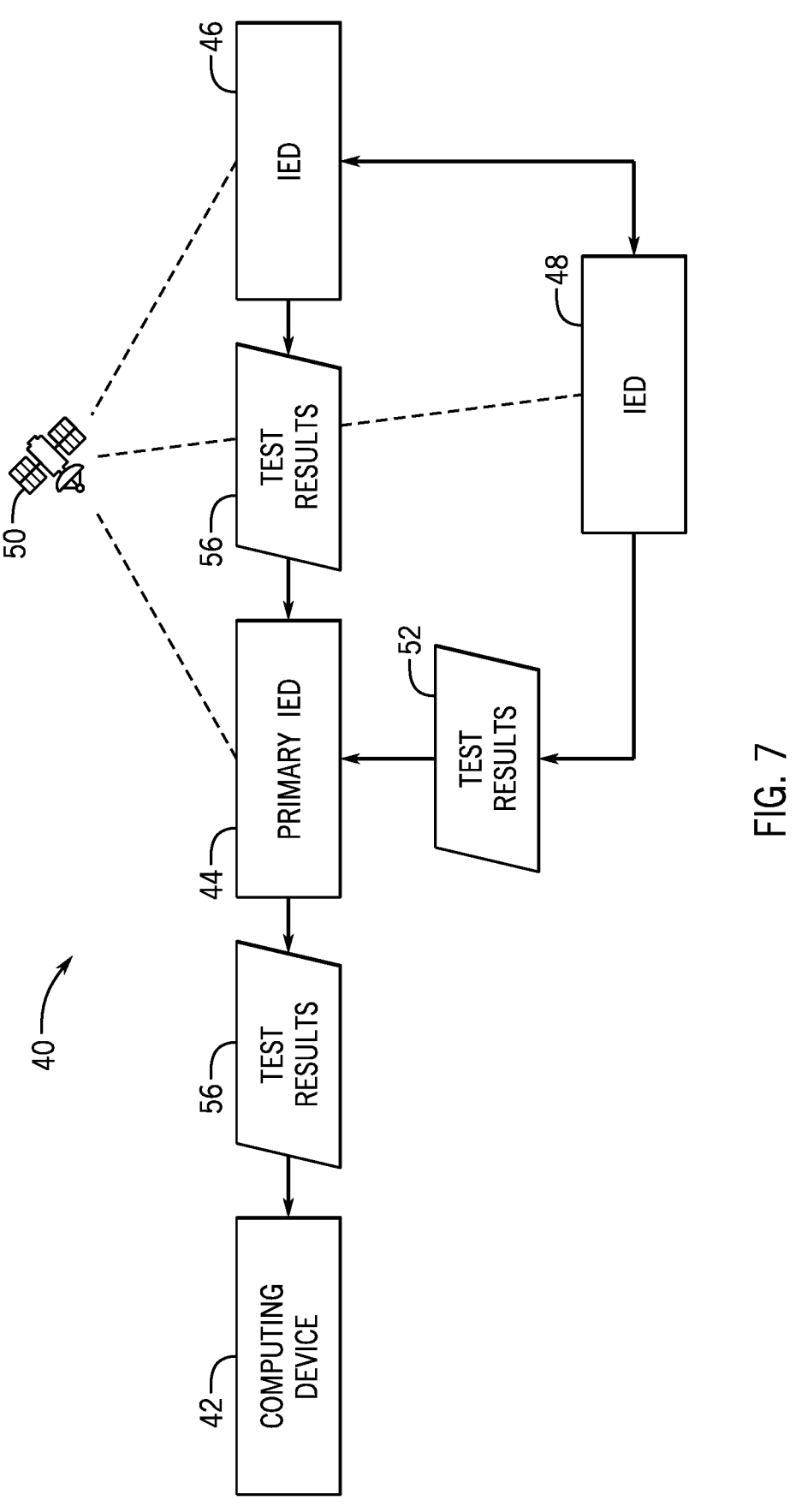
FIG. 7 is a block diagram illustrating an operation for obtaining test results of IEDs of a power delivery system.

FIG. 7 is a schematic block diagram illustrating the system 40 in which test results 56 are generated based on simulation data (e.g., simulation data 52) in response to the initiation of a test. The test results may be generated by the primary IED and the IEDs 46 and 48, and may represent protection signals (e.g., protection signals of a an 87L line current differential protection scheme), warnings, alarms, and/or other responses to the power distribution system conditions represented by the simulation data. For example, the simulation data may include an event report of an overcurrent condition and, in response, the IED 46 may generate test results 56 including instructions to trip a first circuit breaker, the primary IED 44 may generate test results 56 including instructions to trip a second circuit breaker, and the IED 48 may generate test results 56 instructions to activate a warning alarm. In another example, the simulation data 52 may include measurements previously recorded by the primary IED 44, the IED 46, and/or the IED 48, and the test results 56 may characterize behavior in response to the previously recorded measurements (e.g., as a "playback test"). Additionally, the test results may include a label (e.g., header portion, tag, etc.) that associates the test results 56 with a particular IED. In any case, the test results 56 may be routed (e.g., funneled) through the primary IED 44 to the computing device. In some examples, the primary IED 44 compiles the test results generated at the primary IED 44 along with the test results 56 generated by all connected IEDs (e.g., IEDs 46 and 48) before sending the compiled test results to the computing device 42.

Because the protection communications channels are operational during the test mode 34, the test results 56 may also characterize the behavior of the communication channels. For example, the test results 56 may include timestamps indicating the speed of the communication channels. Or, the test results may indicate an incorrect IED operation due to incorrect or missing data in the protection communications. In some examples, the illustrated IEDs may implement data security techniques to ensure the security and/or integrity of the communication channels.

When the test results 56 are received at the computing device 42, the test results may be displayed via the UI of the computing device 42. As such, the test results 56 may be analyzed by an operator of the computing device 42 to characterize the behavior of IEDs associated with the test results. In some examples, the test results 56 are represented as a log (e.g., list, database) of test results 56 and/or stored in memory of the computing device 42. The test results 56 may, as will be described in more detail below, be used to determine a settings update for the primary IED 44 or the IEDs 46 and 48.

Figure 8:
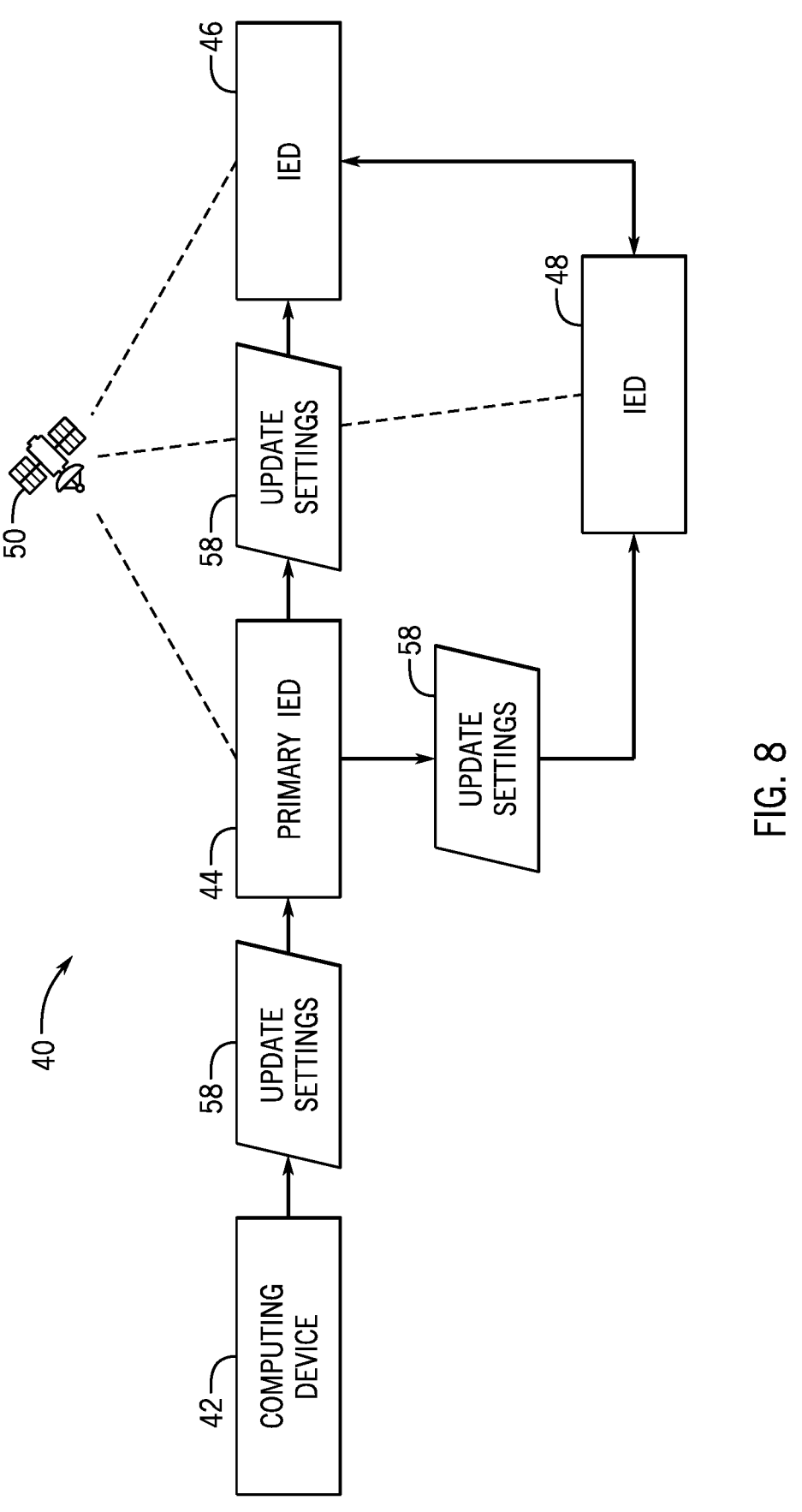
FIG. 8 is a block diagram illustrating an operation for updating settings of IEDs of a power delivery system.

FIG. 8 is a schematic block diagram illustrating the system 40 in which settings updates 58 may be sent from the computing device 42 to the primary IED 44 and to the IEDs

46 and 48 via the primary IED 44. The settings updates 58 may include, for example, firmware updates, security (e.g., cybersecurity) configuration changes, measurement changes, user validation configuration changes, control functions changes, or any other suitable configuration change of an IED. Additionally, the settings updates 58 may be generated based at least in part on the test results 56 and/or the simulation data 52. For example, if the simulation data 52 includes an overcurrent condition, and the test results associated with the IED 46 do not include instructions to trip a circuit breaker, the settings updates may include configuration changes to make the IED 46 more responsive to overcurrent conditions (e.g., by lowering a current threshold). In any case, settings updates 58 may be generated at the computing device 42 and sent to the primary IED 44. The settings updates 58 may then be routed to an IED associated with the settings updates 58. The associated IED may then apply the settings update 58 by, for example, storing instructions for the settings update 58 in memory for the processor of the IED to execute.

Figure 9:
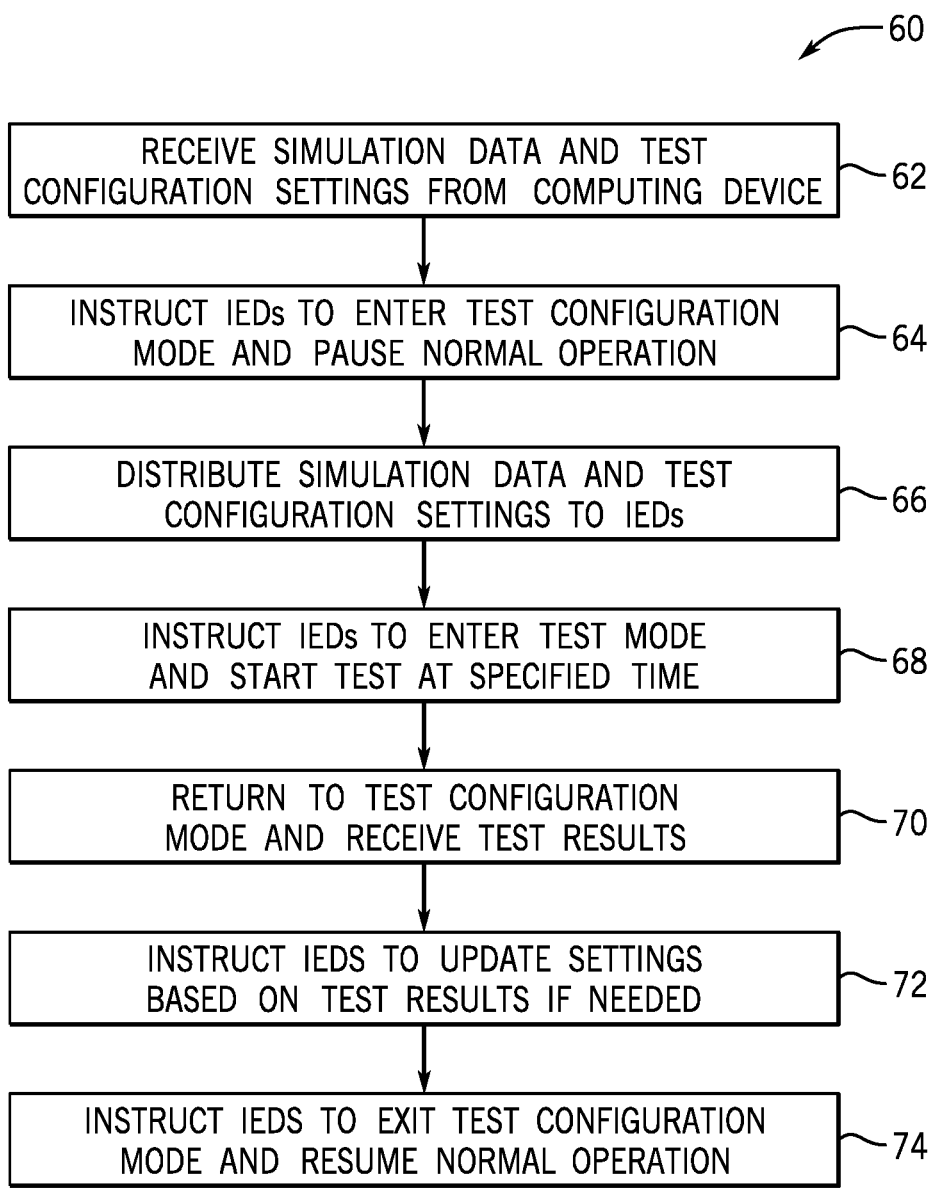
FIG. 9 is a flowchart of a method for performing a synchronized test of a power delivery system.

FIG. 9 is a flowchart for a method 60 for testing aspects of a power distribution system. The method 60 may be used by, for example, the system 40 of FIGS. 4-8. In process block 62, a primary IED (e.g., the primary IED 44) may receive simulation data and test configuration settings from a computing device (e.g., the computing device 42). As described herein, the simulation data may include digital data including currents, voltages, frequencies, event reports, and so on. In process block 64, one or more IEDs (e.g., the primary IED 44, the IEDs 46 and 48) are instructed to enter a test configuration mode and exit normal operating mode. The test configuration mode may disable the protection communications of the one or more IEDs, may block the warnings and alarms associated with the one or more IEDs, and may enable test and/or simulation capabilities of the one or more IEDs. In process block 66, simulation data (e.g., simulation data 52) and test configuration settings are distributed to the one or more IEDs. Process block 66 may include routing the simulation data and test configuration settings to each of the one or more IEDs via the primary IED.

In process block 68, a test is initiated. This may include test instructions being generated at the computing device and distributed to the one or more IEDs via the primary IED. The one or more IEDs may then begin a test procedure at a time based on a common time signal determined by, for example, the primary IED or a common time source (e.g., the common time source 50). In block 70, test results are received. The test results, as described herein, may be generated by the one or more IEDs based on the simulation data, and may characterize the behavior of each of the one or more IEDs in response to the power distribution system conditions represented by the simulated data. The test results may be compiled at the primary IED and/or routed to the computing device via the primary IED. In block 72, the IEDs are instructed to update settings based at least on the test results. The update settings may make various configuration changes to the one or more IEDs, and may be based on a comparison between the test results and expected test results associated with the simulated data. In block 74, the one or more IEDs exit test configuration mode and resume normal operation (e.g., in the normal operating mode). The one or more IEDs may exit the test configuration mode based on, for example, instructions from the primary IED to exit the test configuration mode.

Figure 10:
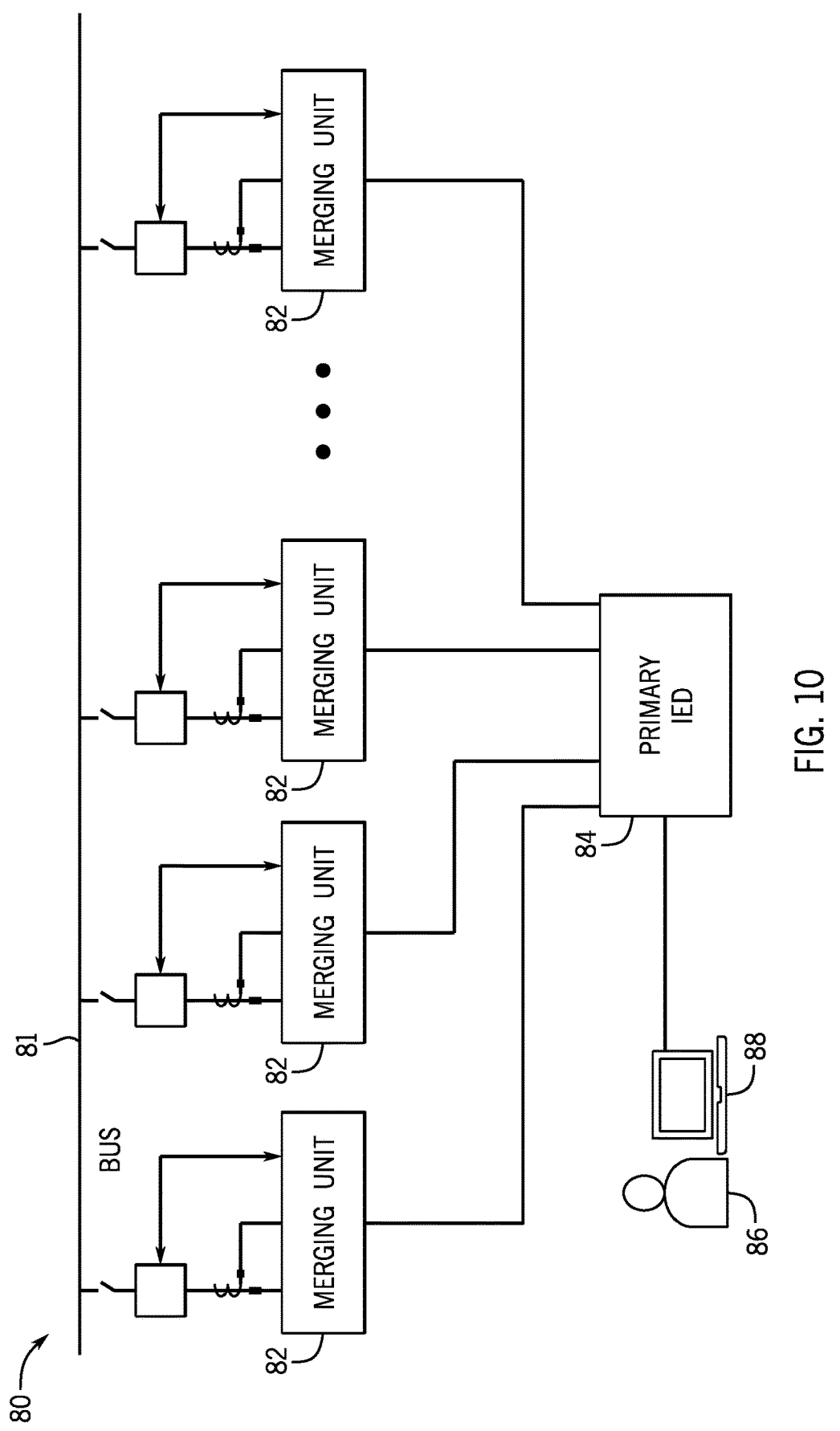
FIG. 10 is a schematic diagram of a system for local synchronized testing of a power delivery system.

FIG. 10 is a schematic block diagram illustrating the system 80 in which a primary IED 84 is connected to one or more merging units 82. While the merging units 82 are shown as merging units for illustrative purposes, in some embodiments, the merging units 82 may include an IED (e.g., the primary IED 44 or the IED 46) or other suitable protection device that may perform protective relaying, control and automation, and merging functions for an electric power delivery system. In the illustrated example, the one or more merging units 82 may monitor conditions of an electric power distribution system 81, and convert detected electrical conditions to digital data. The digital data may then be sent to the primary IED 84 via, for example, ethernet connection. The ethernet connection may also facilitate data transfer from the primary IED 84 to the one or more merging units 82. For example, the primary IED may send or route simulation data, test instructions, and updated settings to the one or more merging units 82. The simulation data, test instructions, and/or updated settings may be generated by the computing device 88 or based on input via the UI of the computing device 88 by an operator 86, and may be sent to the primary IED 84 for distribution to the one or more IEDs 82. In addition, the one or more merging units 82 may transition between a normal operating mode, in which the one or more merging units 82 convert analog electrical values to digital values interpretable by the primary IED 84, a test configuration mode, and a test mode (e.g., as generally described by the test configuration mode 32 and the test mode 34 of FIG. 3).

Figure 11:
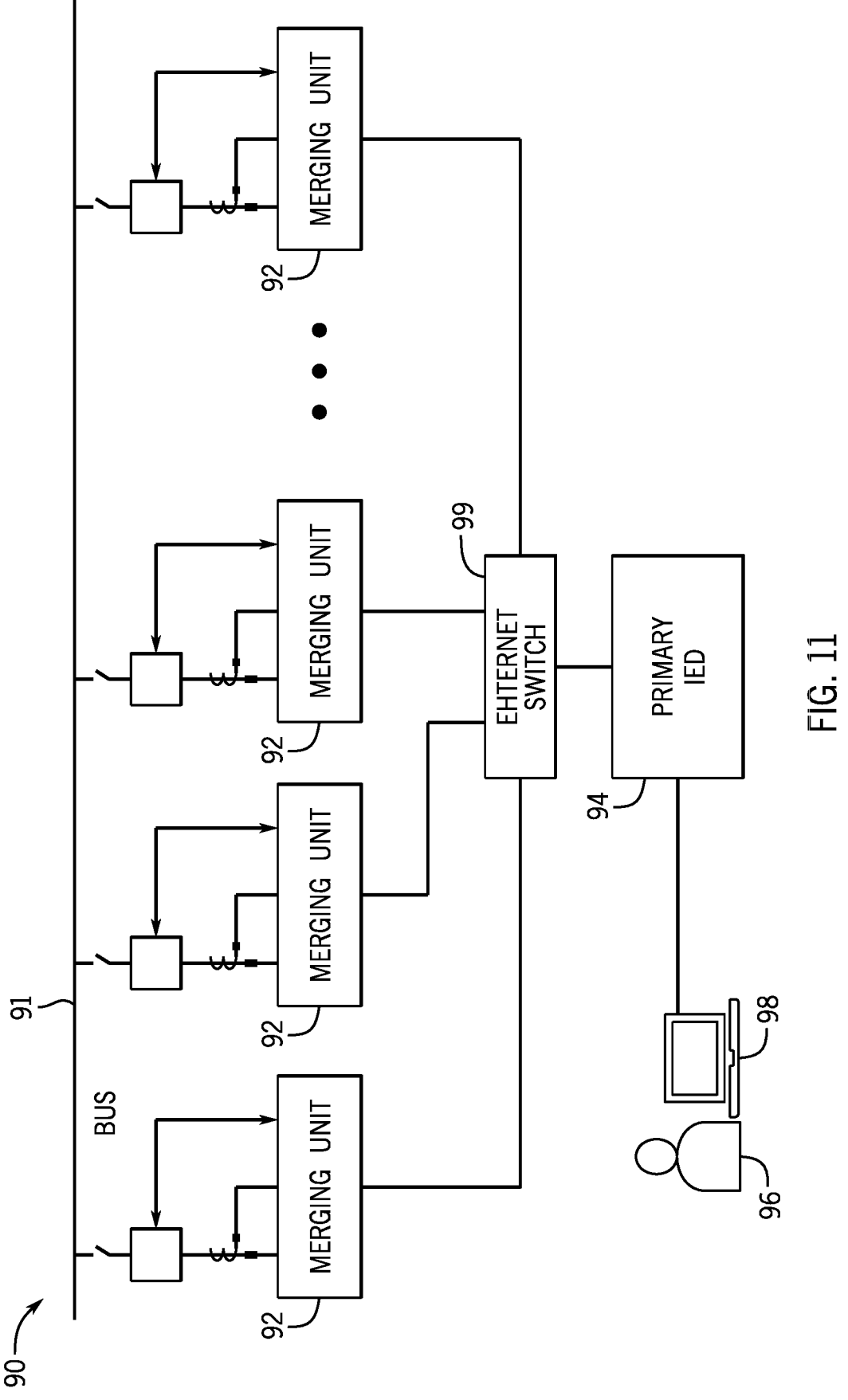
FIG. 11 is a schematic diagram of a synchronized testing system for a power delivery system.

FIG. 11 is a schematic block diagram illustrating the system 90 in which a primary IED 94 is connected to one or more merging units 92 via ethernet switch 99. As with the merging units 82 of FIG. 10, the merging units 92 may, in some embodiments, include an IED or other suitable protection device that may perform protective relaying, control and automation, and merging functions for an electric power delivery system. In the illustrated example, the one or more merging units 92 may monitor an electrical power distribution system 91 and perform various functions (e.g., protection functions) of the electrical power distribution system 91. The ethernet switch may facilitate various network protocols to ease communications between the primary IED 94 and the one or more Merging units 92. The ethernet switch may permit data link layer connections (e.g., layer 2 communications) between the illustrated devices, for example. The facilitation of the various network protocols may also allow test procedures to be performed by the system 90 while ensuring compliance with regulatory standards.

The primary IED 94 may send or route simulation data, test instructions, and update settings to the one or more merging units 92. The simulation data, test instructions, and/or update settings may be generated by the computing device 98 or based on input via the UI of the computing device 98 by an operator 96, and may be sent to the primary IED 94 for distribution to the one or more merging units 92. In addition, the one or more merging units 92 may transition between a normal operating mode, a test configuration mode, and a test mode (e.g., as generally described by the test configuration mode 32 and the test mode 34 of FIG. 3).

Figure 12:
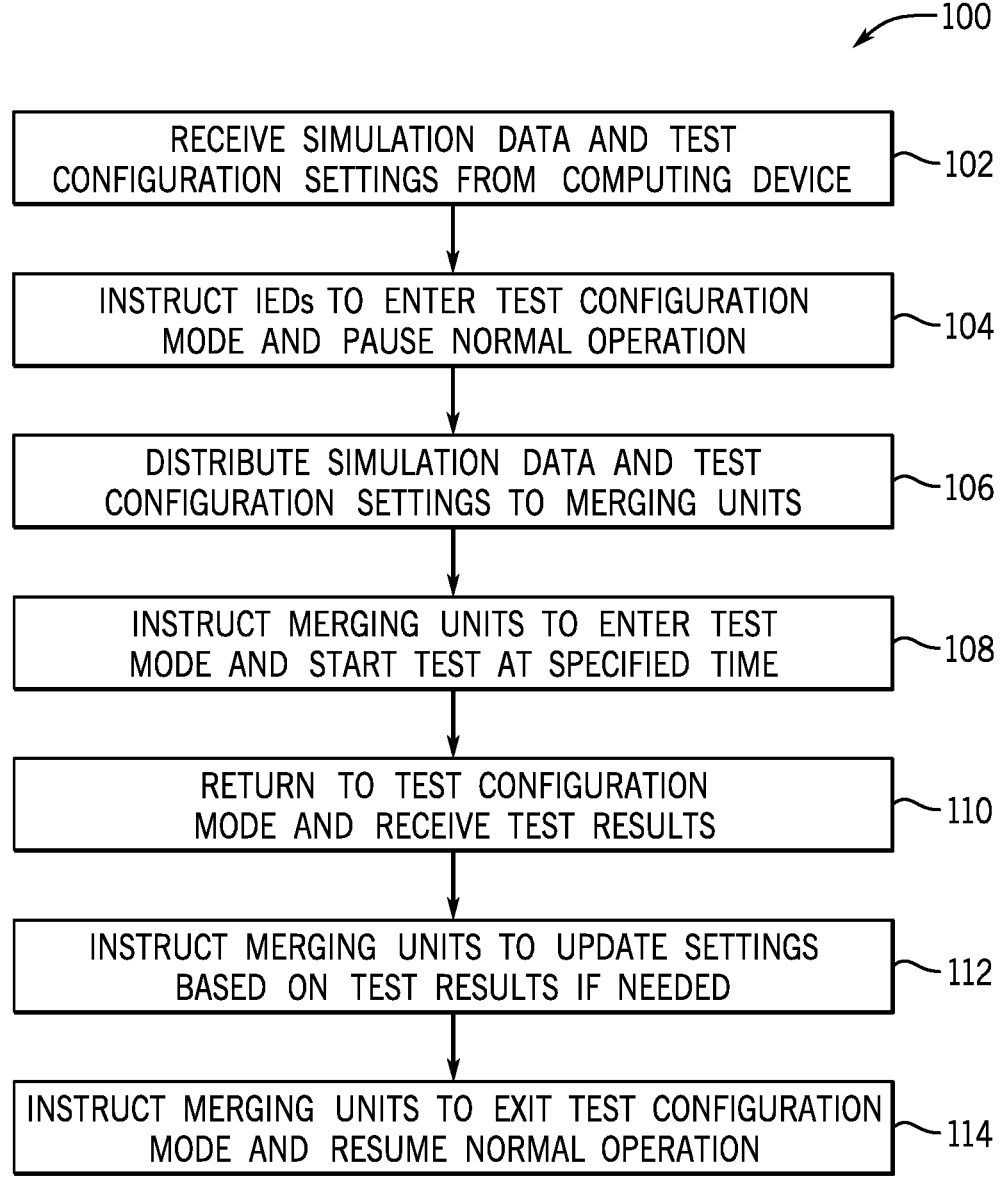
FIG. 12 is a flowchart of a method for performing a local synchronized test of a power delivery system.

FIG. 12 is a flowchart for a method 100 for testing aspects of a power distribution system. While some process blocks refer to merging units (e.g., the one or more merging units 82 of the system 80), the method may also be used for IEDs (e.g., the one or more Merging units 92 of the system 90), and the terms may be used interchangeably. Further, for instances in which the method 100 is performed for/by and IED, the IED may include a protective relay, a controller, a merging unit and/or an automation device. In process block 102, a primary IED, such as the primary IED 84 or the primary IED 94, may receive simulation data and test configuration settings from a computing device, such as the computing device 88 or the computing device 98, respectively. As described herein, the simulation data may include digital data including currents, voltages, frequencies, event reports, and so on. In process block 104, the one or more IEDs are instructed to enter a test configuration mode and exit normal operating mode. The test configuration mode may disable the protection communications of the one or more IEDs, may block the warnings and alarms associated with the one or more IEDs, and may enable test and/or simulation capabilities of the one or more IEDs. In process block 106, simulation data and test configuration settings are distributed to the one or more merging units. Process block 106 may include routing the simulation data and test configuration settings to each of the one or more merging units via the primary IED.

In process block 108, a test is initiated. This may include test instructions being generated at the computing device and distributed to the one or more merging units via the primary IED. The one or more merging units may then begin a test procedure at a time based on a common time signal determined by, for example, the primary IED or a common time source, such as a satellite in communicative connection with the one or more merging units. In block 110, test results are received. The test results, as described herein, may be generated by the one or more merging units based on the simulation data, and may characterize the behavior of each of the one or more merging units in response to the power distribution system conditions represented by the simulated data. As discussed above, in some examples, the merging units may include one or more IEDs. In such examples, the test results may characterize the behavior of the IEDs, such as functionalities of the primary protection systems, control and automation functions, and so on of the IEDs. The test results may be compiled at the primary IED and/or routed to the computing device via the primary IED. In block 112, the merging units may be instructed to update settings based at least on the test results. The update settings may make various configuration changes to the one or more merging units, and may be based on a comparison between the test results and expected test results associated with the simulated data. In block 114, the one or more merging units exit test configuration mode and resume normal operation (e.g., in the normal operating mode). The one or more merging units may exit the test configuration mode based on, for example, instructions from the primary IED to exit the test configuration mode.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112 (f). For any claims containing elements designated in any other manner, however, it is intended that such elements are not to be interpreted under 35 U.S.C. 112(f).

What is claimed is:

1. A system, comprising:
a first intelligent electronic device (IED) of an electric power delivery system, wherein the first intelligent electronic device (IED) is configured in a master-slave arrangement with a plurality of additional intelligent electronic devices (IEDs) to:
receive simulated electric power delivery system measurements, not corresponding to present electric power delivery system measurements, and test configuration settings from a computing device;
transmit a signal indicative of instructions to pause normal operation to the plurality of additional intelligent electronic devices (IEDs);
transmit a signal comprising the simulated electric power delivery system measurements and the test configuration settings to each additional intelligent electronic devices (IED) of the plurality of additional intelligent electronic devices (IEDs);
transmit a signal indicative of instructions to begin a test procedure according to the simulated electric power delivery system measurements and the test configuration settings to each additional intelligent electronic device (IED) of the plurality of additional intelligent electronic devices (IEDs);
receive a signal indicative of test results from each additional intelligent electronic device (IED) of the plurality of additional intelligent electronic devices (IEDs); and
transmit a signal indicative of instructions to resume normal operation to the plurality of additional intelligent electronic devices (IEDs).

2. The system of claim 1, wherein the simulated power delivery system measurements comprise a simulated power delivery system condition previously recorded by the first intelligent electronic device (IED), the plurality of additional intelligent electronic devices (IEDs), or a combination thereof.

3. The system of claim 2, wherein the simulated power delivery system condition comprises a fault condition.

4. The system of claim 3, wherein the fault condition comprises an overcurrent condition.

5. The system of claim 1, wherein the intelligent electronic device (IED) is configured to transmit a signal indicative of instructions to enter a test configuration mode.

6. The system of claim 5, wherein each additional intelligent electronic device (IED) is configured to disable protection communications, block warnings and alarms associated with the additional intelligent electronic device (IED), and load the simulated power delivery system measurements in response to receiving the signal indicative of instructions to enter the test configuration mode.

7. The system of claim 1, wherein the intelligent electronic device (IED) is configured to:

determine respective configuration changes for each additional intelligent electronic device (IED) of the plurality of additional intelligent electronic devices (IEDs) based on the test results; and transmit a signal indicative of instructions to apply the respective configuration changes to each additional intelligent electronic device (IED) of the plurality of additional intelligent electronic devices (IEDs).

8. The system of claim 7, comprising the plurality of additional intelligent electronic devices (IEDs), wherein the plurality of additional intelligent electronic devices (IEDs) are configured to:

receive the signal indicative of instructions to pause normal operation from the first intelligent electronic device (IED);

receive the signal comprising the simulated electric power delivery system measurements and the test configuration settings from the first intelligent electronic device (IED);

receive the signal indicative of instructions to begin a test procedure according to the simulated electric power delivery system measurements and the test configuration settings from the first intelligent electronic device (IED);

perform the test procedure according to the simulated electric power delivery system measurements and the test configuration settings;

transmit the signal indicative of the test results to the first intelligent electronic device (IED);

receive the signal indicative of instructions to apply the respective configuration changes;

apply the respective configuration changes; and receive the signal indicative of instructions to resume normal operation from the first intelligent electronic device (IED).

9. The system of claim 8, wherein the plurality of additional intelligent electronic devices (IEDs) are configured to perform the test procedure simultaneously.

10. The system of claim 9, wherein the plurality of additional intelligent electronic devices (IEDs) are configured to be synchronized by a common time source.

11. A method, comprising:

receiving, in a first intelligent electronic device (IED) of an electric power delivery system in one-to-many communication with a plurality of additional intelligent electronic devices (IEDs), simulated electric power delivery system measurements that do not correspond to present electric power delivery system measurements and test configuration settings from a computing device;

transmitting a signal indicative of instructions to pause normal operation to the plurality of additional intelligent electronic devices (IEDs);

transmitting a signal comprising the simulated electric power delivery system measurements and the test configuration settings to each additional intelligent electronic devices (IED) of the plurality of additional intelligent electronic devices (IEDs);

transmitting a signal indicative of instructions to begin a test procedure according to the simulated electric power delivery system measurements and the test configuration settings to each additional intelligent electronic device (IED) of the plurality of additional intelligent electronic devices (IEDs);

receiving a signal indicative of test results from each additional intelligent electronic device (IED) of the plurality of additional intelligent electronic devices (IEDs); and transmitting a signal indicative of instructions to resume normal operation to the plurality of additional intelligent electronic devices (IEDs).

12. The method of claim 11, wherein the simulated power delivery system measurements comprise a simulated power delivery system condition.

13. The method of claim 12, wherein the simulated power delivery system condition comprises a fault condition.

14. The method of claim 13, wherein the fault condition comprises an overcurrent condition.

15. The method of claim 11, wherein the intelligent electronic device (IED) is configured to transmit a signal indicative of instructions to enter a test configuration mode.

16. A non-transitory computer-readable medium comprising computer-executable instructions that, when executed, are configured to cause data processing circuitry to perform operations comprising:

transmitting simulated electric power delivery system measurements that do not correspond to present conditions of the electric power delivery system and test configuration settings to an intelligent electronic device (IED) to cause the intelligent electronic device (IED) to control a test of a plurality of additional intelligent electronic devices (IEDs) in a primary-secondary arrangement based on operations comprising:

transmitting a signal indicative of instructions to pause normal operation to the plurality of additional intelligent electronic devices (IEDs);

transmitting a signal comprising the simulated electric power delivery system measurements and the test configuration settings to each additional intelligent electronic devices (IED) of the plurality of additional intelligent electronic devices (IEDs);

transmitting a signal indicative of instructions to begin a test procedure according to the simulated electric power delivery system measurements and the test configuration settings to each additional intelligent electronic device (IED) of the plurality of additional intelligent electronic devices (IEDs); and receiving a signal indicative of test results from each additional intelligent electronic device (IED) of the plurality of additional intelligent electronic devices (IEDs).

17. The non-transitory computer-readable medium comprising computer-executable instructions of claim 16, wherein the instructions that, when executed, are configured to cause data processing circuitry to perform operations comprising:

causing the plurality of additional intelligent electronic devices (IEDs) to enter a test configuration mode.

18. The non-transitory computer-readable medium comprising computer-executable instructions of claim 17, wherein the test configuration mode causes the plurality of additional intelligent electronic devices (IEDs) to disable communication protections, block warnings and alarms associated with the additional intelligent electronic device (IED), and load the simulated power delivery system measurements.

19. The non-transitory computer-readable medium comprising computer-executable instructions of claim 16, wherein the instructions that, when executed, are configured to cause data processing circuitry to perform operations comprising:

causing the plurality of additional intelligent electronic devices (IEDs) to perform the test procedure simultaneously.

20. The non-transitory computer-readable medium comprising computer-executable instructions of claim 16, wherein each additional intelligent electronic devices (IEDs) comprises a respective merging unit.

\*  \*  \*  \*  \*